United States Patent [19]

Hirano et al.

[11] Patent Number: 5,095,232

[45] Date of Patent: Mar. 10, 1992

[54] TIMING SIGNAL DELAY CIRCUIT WITH HIGH RESOLUTION OR ACCURACY

[75] Inventors: Kazuhiko Hirano; Junichi Saito; Takafumi Uehara, all of Tokyo, Japan

[73] Assignee: Ando Electric Co., Ltd., Tokyo, Japan

[21] Appl. No.: 625,266

[22] Filed: Dec. 10, 1990

[30] Foreign Application Priority Data

Dec. 15, 1989 [JP] Japan .................................. 1-325623

[51] Int. Cl.⁵ ..................... H03K 5/159; G01R 29/02; G01D 00/00
[52] U.S. Cl. .................................. 307/590; 307/595; 307/597; 307/602; 307/603; 307/605; 328/55; 328/129.1; 377/20
[58] Field of Search ............... 307/590, 595, 597, 600, 307/602, 603, 605, 269; 328/55, 60, 129.1; 377/20

[56] References Cited

U.S. PATENT DOCUMENTS

| | | | |
|---|---|---|---|
| 3,725,793 | 4/1973 | Phillips | 307/595 |
| 4,626,716 | 12/1986 | Miki | 307/595 |
| 4,800,304 | 1/1989 | Takeuchi | 307/602 |
| 4,845,390 | 7/1989 | Chan | 307/595 |

*Primary Examiner*—Stanley D. Miller
*Assistant Examiner*—Trong Phan
*Attorney, Agent, or Firm*—Seidel, Gonda, Lavorgna & Monaco

[57] ABSTRACT

A timing signal delay circuit comprises a counter placed with first delay setting data (21-24) for counting a first clock signal (12) in response to an input timing pulse (11), and a first flip-flop circuit which has a D-input supplied with the output of the counter (1) and a clock input supplied with a second clock signal of the same timing frequency as the first clock signal. For doubling resolution of the delay which the input timing pulse undergoes, there are provided an exclusive-OR gate (4) supplied with a second dealy data signal (31) and a third clock signal (14) of the same timing as the second clock signal (13), an AND gate (5) supplied with the output of the exclusive-OR gate (4) and that of the first flip-flop (3), and a second flip-flop supplied with the output of the AND gate (5) and a fourth clock signal (15) having twice as high frequency as that of the first clock (12). The input timing pulse can be delayed with high resolution or accuracy.

3 Claims, 3 Drawing Sheets

TIMING SIGNAL DELAY CIRCUIT WITH HIGH RESOLUTION OR ACCURACY

BACKGROUND OF THE INVENTION

1. Field of the Invention

The present invention generally relates to a timing signal delay circuit. More particularly, the invention is concerned with a delay circuit for delaying an input timing pulse signal with twice as high resolution as that of data set for the delay.

2. Description of the Prior Art

For having a better understanding of the present invention, a timing signal delay circuit known heretofore will be considered in some detail by referring to FIG. 3 of the accompanying drawings.

In FIG. 3, a reference numeral 1 denotes a counter, 2 denotes a detection circuit for detecting all "0s" making appearance at the output terminals of the counter 1, and a numeral 3 denotes a first flip-flop (FF) circuit. Further, a reference numeral 11 designates an input timing pulse as well as an input terminal therefor, 12 designates a first clock signal, 13 designates a second clock signal, 21 to 24 designate delay setting data placed in the counter 1, and a numeral 16 designates a delayed timing pulse signal output. The counter 1 shown in FIG. 3 is implemented as a down-counter and placed initially with the delay setting data 21 to 24.

In operation, when the timing pulse signal 11 is supplied, the counter 1 responds to the first clock pulse signal 12 to start the count-down operation of the delay setting data placed therein. When it is detected by the detection circuit 2 that all the outputs of the counter 1 becomes "0s", the timing pulse signal is outputted in response to the rising edge of the second clock pulse 13.

More specifically, reference is made to FIG. 4 which is a timing chart for illustrating the operation of the timing pulse signal delay circuit shown in FIG. 3.

In FIG. 4, there is shown at (a) a waveform of the input timing pulse signal 11. A waveform of the first clock signal 12 is shown at (b). The delay setting data 21 to 24 placed in the down-counter 1 are illustrated at (c) to (f), respectively. In the case of this example, the delay setting data is assumed to be "0110".

Upon application of the input timing pulse signal 11, the down-counter 1 starts the down-count operation in synchronism with the first clock pulse signal 21, as shown in FIG. 4 at (g) to (j). When all the delay data 21 to 24 are counted down to "0s", the detection circuit 2 produces an output pulse signal of a waveform shown at (k), which is applied to the flip-flop circuit 3. At the timing of the rising edge of the second clock pulse signal 13, the flip-flop circuit 3 outputs the delayed timing pulse signal 16, as shown at (m) in FIG. 4. In this manner, the timing pulse signal delay circuit shown in FIG. 3 delays the output timing pulse signal 16 shown at (m) in FIG. 4 relative to the input timing pulse signal 11 shown at (a) with the amount of delay determined by the delay setting data placed in the counter 1.

At this juncture, it should be mentioned that the counter 1 shown in FIG. 3 may be implemented as an up-counter as well.

SUMMARY OF THE INVENTION

The prior art timing pulse signal delay circuit described above is disadvantageous in that when twice as high resolution of the delay as that of the delay setting data placed in the counter is to be obtained, the clock frequency must be doubled, which in turn means that operation speed of the whole circuit has to be increased correspondingly.

An object of the present invention is therefore to provide a timing pulse signal delay circuit which can evade the problem of the hitherto known timing pulse delay circuit mentioned above.

In view of the above and other objects which will be more apparent as description proceeds, there is provided according to an aspect of the present invention a delay circuit for delaying a timing pulse signal by a preset amount, which circuit comprises counter means placed with first delay setting data representing the preset amount of delay which the input timing pulse is to undergo and having a timing pulse signal input terminal to which the timing pulse signal to be delayed is applied and a first clock input terminal to which a first clock signal is applied, the counter counting the first clock signal in response to application of the timing pulse signal until the preset amount of delay has been attained, whereupon the counter means produces an output pulse, a first flip-flop circuit having a first input terminal to which the output pulse of the counter means is applied and a clock input terminal to which a second clock signal having the same timing frequency as the first clock signal is applied, an exclusive-OR circuit having a first input terminal to which a third clock signal having the same timing frequency as the second clock signal is applied and a second input terminal to which a second delay signal defining resolution of the delay is applied, an AND circuit having a first input terminal to which the output of the exclusive-OR circuit is applied and a second input terminal to which the output of the first flip-flop circuit is applied, and a second flip-flop circuit having a first input terminal to which the output of the AND circuit is applied, a second input terminal to which a fourth clock signal having twice as high frequency as that of the first clock signal is applied and an output terminal at which an output timing pulse signal delayed relative to the input timing pulse signal by the preset amount is produced.

According to the teachings of the present invention, the second delay data signal added for doubling the resolution or accuracy of the delay is exclusively ORed with the third clock signal, whereon the result of the exclusive ORing is ANDed with the output of the first flip-flop circuit, whereby the logical product pulse signal is adjusted in timing by the fourth clock signal having twice as high frequency as that of the first clock signal. In this manner, the input timing pulse can be delayed with twice as high resolution or accuracy as that realized by the prior art timing signal delay circuit described hereinbefore. Alternatively, the timing pulse delay circuit can be implemented more inexpensively with lower power consumption for same resolution or accuracy of the delay as that of the prior art timing pulse delay circuit.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE PREFERRED EMBODIMENTS

Now, the present invention will be described in detail in conjunction with an exemplary or preferred embodiment thereof by reference to FIGS. 1 and 2.

Figure 1:
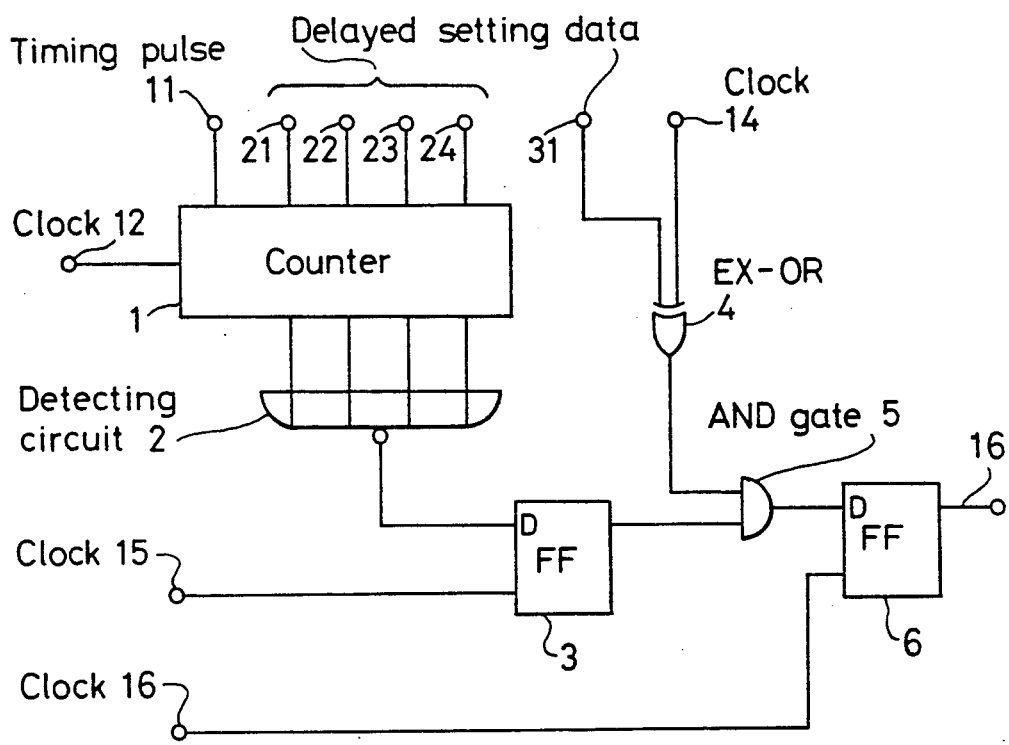
FIG. 1 is a schematic circuit diagram showing an arrangement of a timing pulse signal delay circuit according to an exemplary embodiment of the present invention.

Referring to FIG. 1, the timing pulse signal delay circuit according to an embodiment of the invention comprises a counter 1 in which first delay setting data 21 to 24 are placed and which counts first clock pulses 12 in response to an input timing pulse signal 11, a detection circuit 2 for detecting all "0s" making appearance at the outputs of the counter 1, a first flip-flop (FF) circuit 3 having a first input terminal (D) to which the output of the detection circuit 2 is applied and a second input terminal to which a second clock pulse signal having the same frequency as that of the first clock pulse signal 12 is applied, an exclusive-OR circuit 4 having a first input terminal supplied with a third clock pulse signal 14 having the same frequency as the second clock pulse signal 13 and a second input terminal supplied with a second delay data signal 31, an AND circuit 5 having a first input terminal supplied with the output of the exclusive-OR circuit 4 and a second input terminal connected to the output terminal of the first flip-flop circuit 3, and a second flip-flop circuit 6 having a first input terminal (D) connected to the output of the AND gate 5 and a second input terminal to which a fourth clock pulse signal 15 having twice as high frequency as that of the first clock signal 12 is applied.

Figure 3:
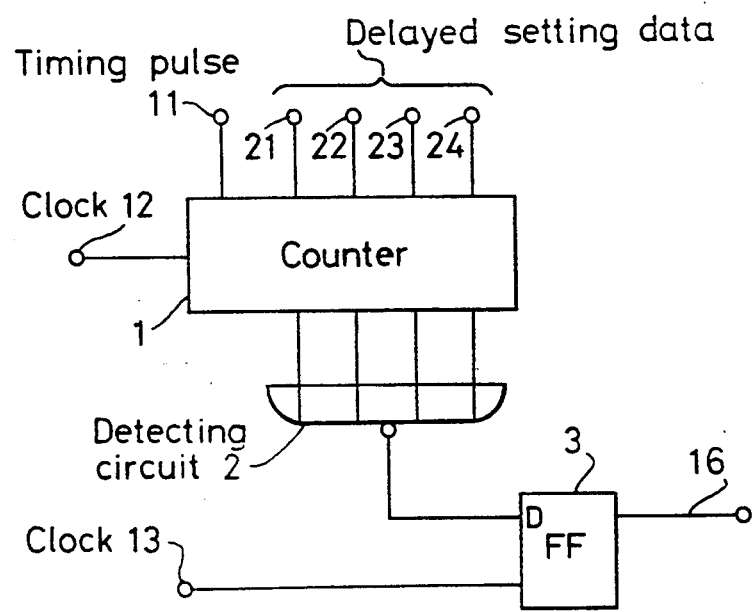
FIG. 3 is a circuit diagram showing a timing pulse signal delay circuit known heretofore.

As will be appreciated from the above, the timing pulse signal delay circuit according to the illustrated embodiment of the invention differs from the hitherto known circuit shown in FIG. 3 in that there are additionally provided the exclusive-OR gate 4, the AND circuit 5 and the second flip-flop circuit 6, wherein the second delay data 31 is employed. More specifically, the exclusive-OR gate 4 has the inputs supplied with the third clock signal 14 having the same timing frequency as that of the second clock signal 13 and the second delay data signal 31, respectively. The AND gate 5 has the inputs supplied with the output of the exclusive-OR gate 4 and that of the first flip-flop circuit 3, respectively. The second flip-flop 6 has the D-input terminal supplied with the output of the AND gate 5 and a fourth clock signal 15 having twice as high frequency as that of the first clock signal 12. By way of example, the fourth clock signal 15 may have a frequency of 1 GHz on the assumption that the first clock signal 12 has a frequency of 500 MHz.

Now, operation of the timing pulse signal delay circuit shown in FIG. 1 will be described in detail by reference to FIG. 2 which shows signal waveforms at various circuit points shown in FIG. 1.

Figure 2:
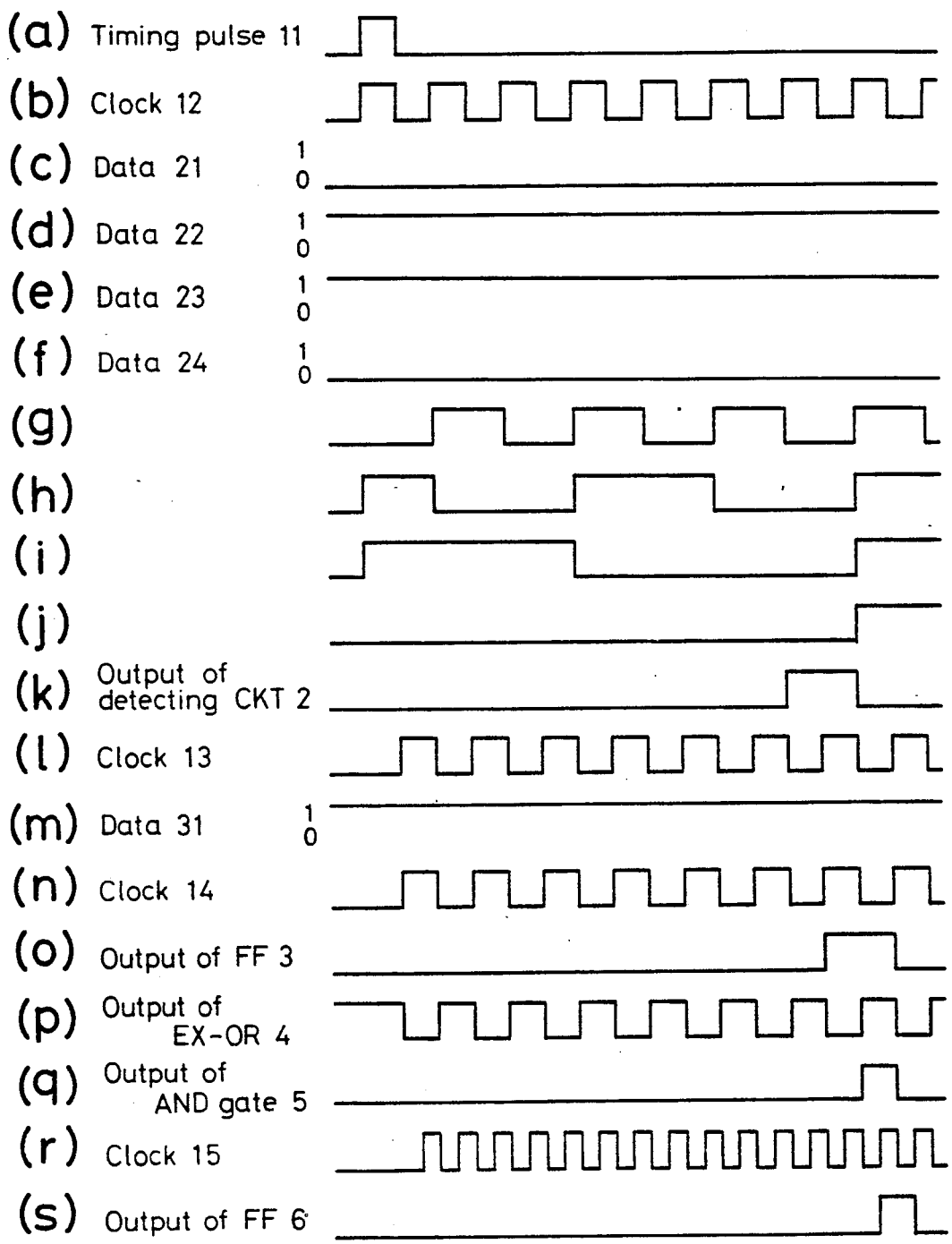
FIG. 2 is a timing chart for illustrating operation of the timing pulse signal delay circuit shown in FIG. 1.
Figure 4:
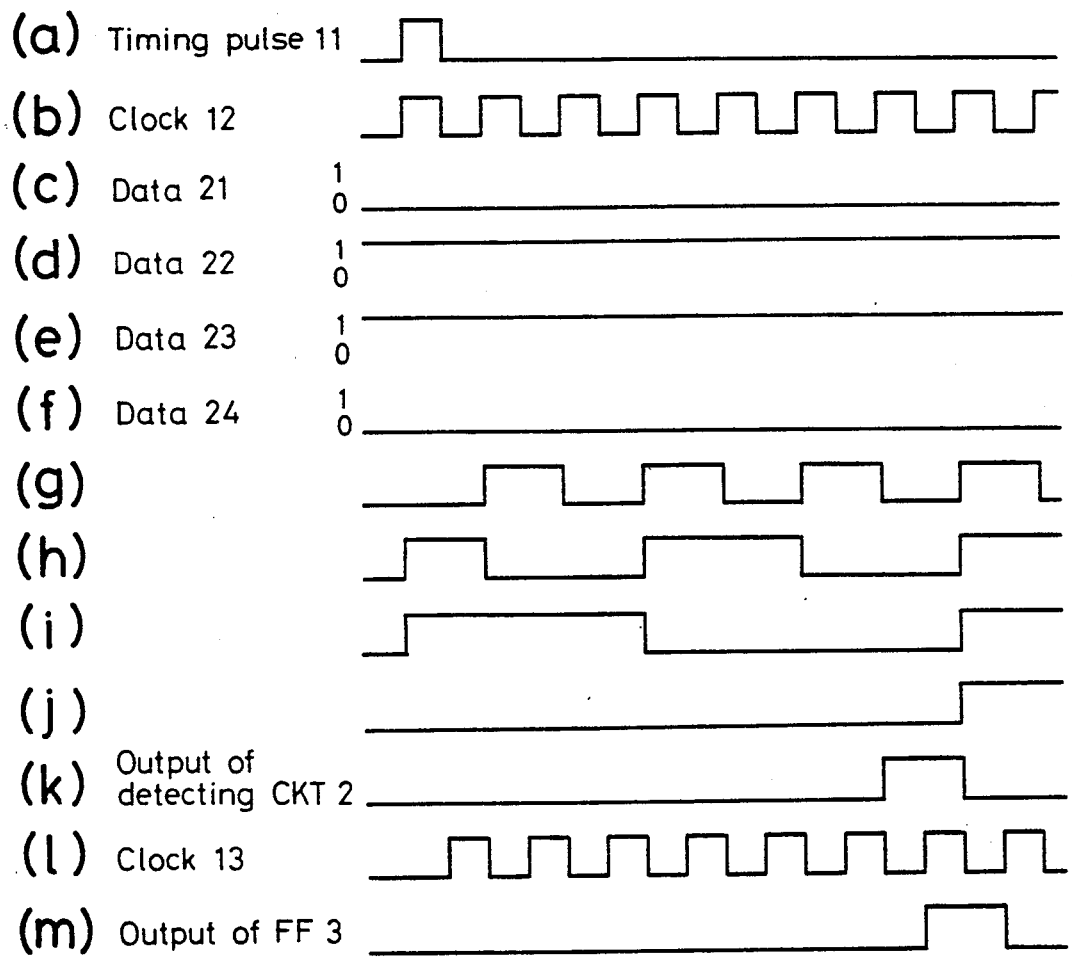
FIG. 4 is a timing chart for illustrating operation of the delay circuit shown in FIG. 3.

In FIG. 2, waveforms (a) to (1) are same as those shown in FIG. 4 at (a) to (1), respectively. Accordingly, repeated description of these signals will be unnecessary.

Shown at (m) in FIG. 2 is a waveform of the delay setting data 31 which is set to logic "1" in the case of the illustrated embodiment.

Shown at (n) in FIG. 2 is a waveform of the fourth clock signal 14 which is same as that of the second clock signal 13 and in synchronism with the latter.

Shown at (o) in FIG. 2 is the output waveform of the first flip-flop circuit 3 which corresponds to the waveform shown at (m) in FIG. 4.

Shown at (p) in FIG. 2 is the output waveform of the exclusive-OR gate 4 which corresponds to the inverted waveform of the third clock signal 14 because the second delay setting data 31 is set to logic "1". At this juncture, it should be noted that the output waveform of the exclusive-OR gate 4 is same as the waveform of the third clock signal 14, when the second delay setting data is of logic "0".

Shown at (q) in FIG. 2 is the output waveform of the AND gate 5. This waveform (g) corresponds to a logical product of the output (o) of the flip-flop circuit 3 and the output (p) of the exclusive-OR gate 4. In this connection, it should be noted that when the second delay setting data 31 is logic "0", the output waveform (p) of the exclusive-OR gate 4 is shifted to the left by a half-period relative to the third clock signal 14, as viewed in FIG. 2.

Shown at (r) in FIG. 2 is a waveform of the fourth clock signal 15 which has twice as high frequency as that of the second clock signal 13.

Shown at (s) in FIG. 2 is an output waveform of the second flip-flop 6 which is outputted therefrom at the timing of the fourth clock signal 15 and corresponds to the waveform of the input timing pulse 11 delayed relative thereto for a time determined by the delay setting data placed in the counter 1 with twice as high resolution as that of the delayed timing pulse shown in FIG. 4 at (m).

It should be mentioned that even when the second delay data 31, the output of the first flip-flop circuit 3 and the third clock signal 14 differ from those described above in respect to the logic level and/or phase, same result as mentioned above can be obtained by modifying correspondingly the logical operation.

As will now be appreciated from the foregoing description, according to the teachings of the invention that the (second) delay setting data (31) additionally employed for doubling the resolution of delay and the third clock signal (14) which is same as the second clock signal (15) are exclusively ORed by the gate (4), whereon the output of the exclusive-OR gate (4) and that of the first flip-flop (3) are logically ANDed by the gate (5) whose output is applied to the D-input terminal of the second flip-flop circuit (6) having the clock input supplied with the fourth clock signal (16) having twice as high frequency as that of the first clock signal (12), the output timing pulse (16) can be delayed relative to the input timing pulse (11) with twice as high resolution of delay when compared with the output timing pulse (16) in the prior art timing pulse delay circuit shown in FIG. 3. On the other hand, when a timing pulse signal delay circuit exhibiting a same resolution (accuracy) of delay is implemented in the same circuit configuration as that shown in FIG. 1, the timing pulse signal delay circuit can then be realized more inexpensively with a reduced power consumption.

It is thought that the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

What is claimed is:

1. A delay circuit for delaying a timing pulse signal by a preset amount, comprising:

counter means placed with first delay setting data representing said preset amount of delay and having a timing pulse signal input terminal to which a timing pulse signal to be delayed is applied and a first clock input terminal to which a first clock signal is applied, said counter means counting said first clock signal in response to application of said timing pulse signal until said preset amount of delay has been attained, whereupon said counter means produces an output pulse;

a first flip-flop circuit having a first input terminal to which the output pulse of said counter means is applied and a clock input terminal to which a second clock signal having a same frequency as said first clock signal is applied;

an exclusive-OR circuit having a first input terminal to which a third clock signal having a same frequency as said second clock signal is applied and a second input terminal to which a second delay setting data signal representing a resolution factor of the delay is applied;

an AND circuit having a first input terminal to which the output of said exclusive-OR circuit is applied and a second input terminal to which the output of said first flip-flop circuit is applied; and a second flip-flop circuit having a first input terminal to which the output of said AND circuit is applied, a second input terminal to which a fourth clock signal having twice as high frequency as that of said first clock signal is applied and an output terminal at which an output timing pulse signal delayed relative to said input timing pulse signal by said preset amount is produced.

2. A timing signal delay circuit according to claim 1, wherein said counter means is composed of a counter having a plurality of bit output terminals corresponding to a number of bits of said first delay setting data, and a detection circuit having input terminals connected to said output bit terminals, respectively, for detecting that all bit outputs of said counter assume the same logical value, to thereby output the signal to be applied to the first input terminal of said first flip-flop circuit.

3. A timing signal delay circuit according to claim 2, wherein said first delay setting data is of four bits while said second delay data signal is of one bit.

* * * * *